(12) United States Patent
Tai

(10) Patent No.: US 7,679,380 B2
(45) Date of Patent: Mar. 16, 2010

(54) OVERCURRENT DETECTION DEVICE

(75) Inventor: Jy-Der David Tai, Sanchong (TW)

(73) Assignee: Tai-1 Microelectronics Corp., Taipei County (TW)

( * ) Notice: Subject to any disclaimer, the term of this patent is extended or adjusted under 35 U.S.C. 154(b) by 291 days.

(21) Appl. No.: 12/025,040

(22) Filed: Feb. 3, 2008

(65) Prior Publication Data

US 2009/0160428 A1   Jun. 25, 2009

(30) Foreign Application Priority Data

Dec. 21, 2007   (TW) .............................. 96149230 A

(51) Int. Cl.
    *G01R 27/08*   (2006.01)
(52) U.S. Cl. .................... 324/713; 324/251; 324/297
(58) Field of Classification Search ................. 324/713
    See application file for complete search history.

(56) References Cited

U.S. PATENT DOCUMENTS

| 5,008,586 | A | * | 4/1991 | Miyazaki et al. ............ 323/315 |
| 5,510,753 | A | * | 4/1996 | French ........................ 330/146 |
| 6,108,182 | A | * | 8/2000 | Pullen ......................... 361/89 |

* cited by examiner

*Primary Examiner*—Timothy J Dole
*Assistant Examiner*—Benjamin M Baldridge
(74) *Attorney, Agent, or Firm*—Ming Chow; Sinorica, LLC

(57) ABSTRACT

The present invention discloses an overcurrent detection device, which uses a first NOT gate and a second NOT gate to reverse the logic states of a first digital signal and a second digital signal which are digitalized audio signals in a class D power amplifier. Next, a CMOS transistor receives the reversed digital signals and drives a load. A comparing circuit detects the current of the load and compares the current with the reversed first and second digital signals. When the current of the load is too high, the comparing circuit respectively outputs a first electrical signal and a second electrical signal to a first logic gate and a second logic gate. Then, the logic gate outputs a signal to activate a protection circuit to prevent the entire circuit be damaged or burned out.

15 Claims, 6 Drawing Sheets

US 7,679,380 B2

OVERCURRENT DETECTION DEVICE

BACKGROUND OF THE INVENTION

1. Field of the Invention

The present invention relates to a detection device, particularly to an overcurrent detection device.

2. Description of the Related Art

With the prevalence of IC technology, CMOS (Complementary Metal Oxide Semiconductor) is also extensively used in various electronic elements, such as the Class-D audio power amplifier. The Class-D audio power amplifier is a high-efficiency amplifier outputting only two states (1 and 0) and usually used to drive a high-load speaker. As the Class-D audio power amplifier has very high energy conversion efficiency, it has been widely used in portable electronic products and can reduce the power consumption of portable electronic products. Thus, the standby time is prolonged, and the portability of electronic products is increased.

Refer to FIG. 1 for a conventional overcurrent detection device. A common power amplifier uses a current detector to detect the load current. When the current is over a given value, a protection circuit is triggered. Such an architecture usually needs a comparator 10 and a detection resistor 12. The comparator 10 receives the voltages at two terminals of the detection resistor 12 as the input signals and outputs a voltage signal to trigger a protection circuit.

In a class D power amplifier the audio signal is a digital signal and the conventional current detector can no longer be applied. Therefore the present invention proposes an overcurrent detection scheme, which achieves overcurrent detection by applying digitalized audio signal as control signal. Therefore, the present invention proposes an overcurrent detection device, which detects the overcurrent of the load through digitalized audio signal.

SUMMARY OF THE INVENTION

The primary objective of the present invention is to provide an overcurrent detection device, which can accurately detect the overcurrent of the load in real time via a digital circuit and digital signals.

Another objective of the present invention is to provide an overcurrent detection device, which detects the overcurrent of the load through digitalized audio signal.

To achieve the abovementioned objectives, the present invention proposes an overcurrent detection device, which comprises: a first NOT gate and a second NOT gate. The first NOT gate and the second NOT gate respectively receive a first digital signal and a second digital signal, digitalized audio signal, from the input terminals thereof and reverse the logic states of the first digital signal and the second digital signal. A CMOS (Complementary Metal Oxide Semiconductor) transistor is coupled to the output terminals of the first and second NOT gates to receive the reversed first and second digital signals and drives a load. The output terminals of the CMOS and NOT gates are coupled to a comparing circuit. The comparing circuit receives the reversed first and second digital signals from two terminals thereof, detects the current of the load, compares the detection result with the first and second digital signals and then selectively outputs a first electrical signal and a second electrical signal. A first logic gate and a second logic gate are coupled to the comparing circuit, respectively receive the first and second electrical signals and output a first signal and a second signal to a protection circuit.

Below, the preferred embodiments are to be described in detail in cooperation with the drawings to make easily understood the technical contents, characteristics and efficacies of the present invention.

Like item numbers denote like items in the various drawings.

DETAILED DESCRIPTION OF THE INVENTION

Figure 1:
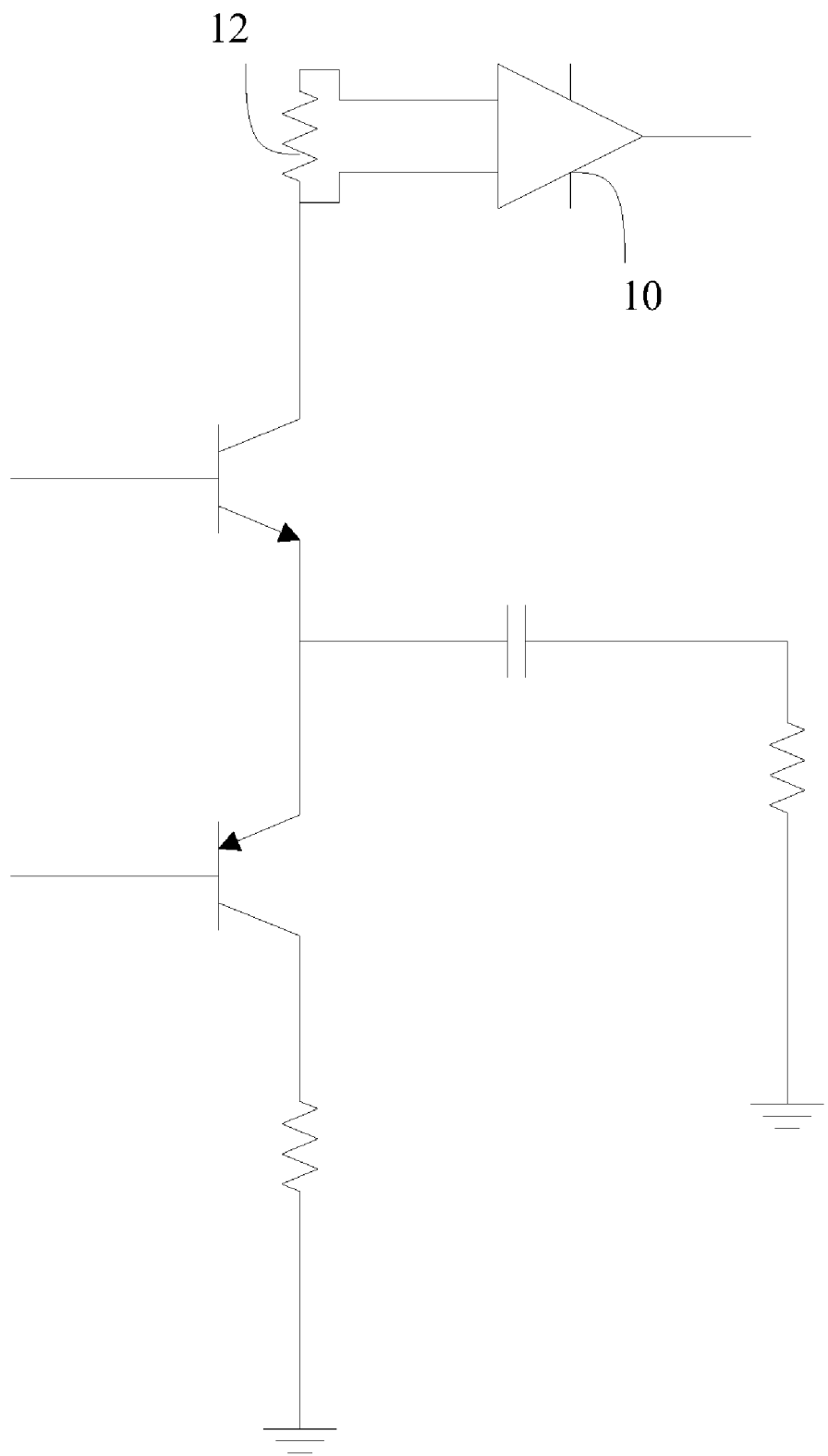
FIG. 1 is a diagram schematically showing the circuit of a conventional overcurrent detection device.
Figure 2:
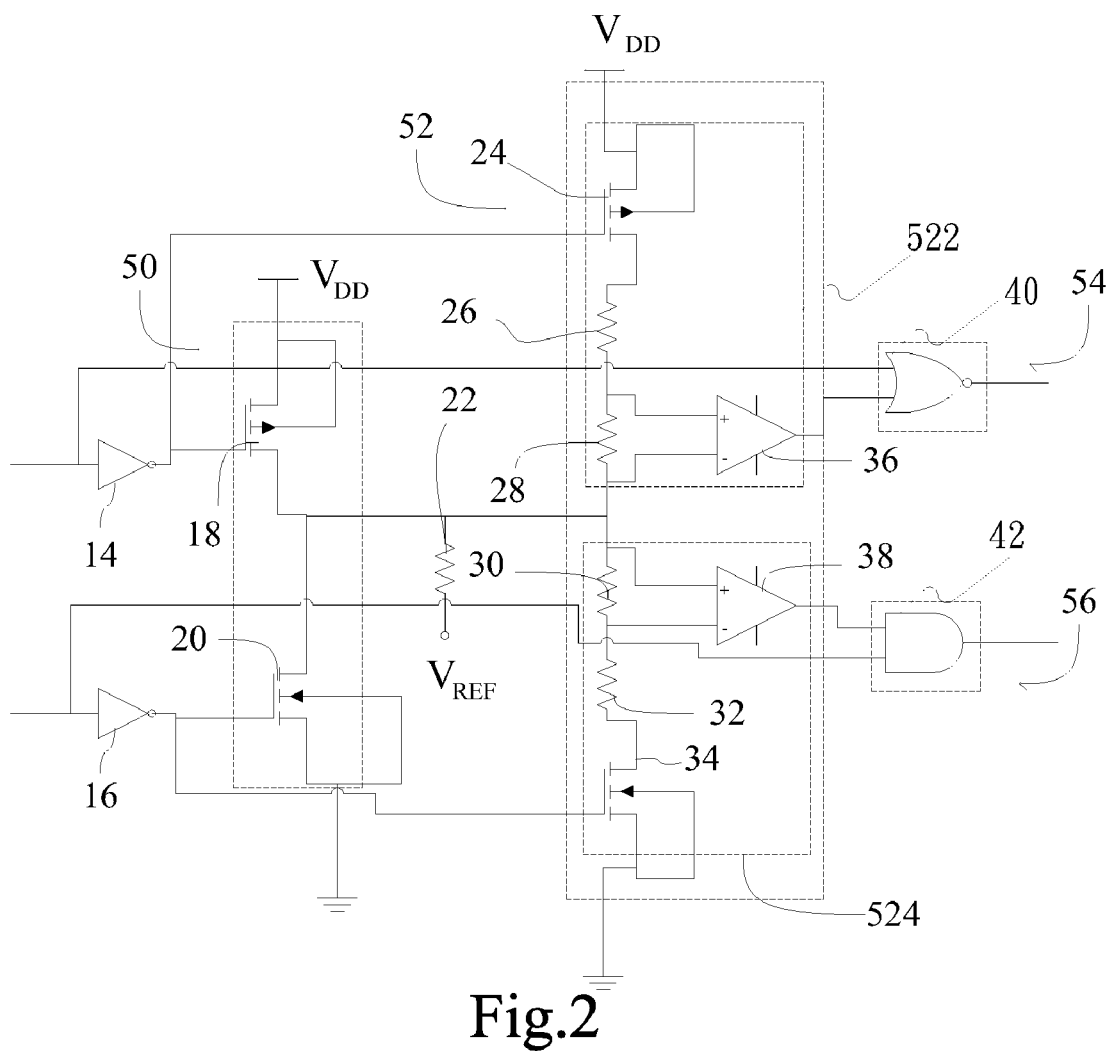
FIG. 2 is a diagram schematically showing the circuit of an overcurrent detection device according to the present invention.

Refer to FIG. 2 a diagram schematically showing the circuit of an overcurrent detection device according to the present invention. The device of the present invention comprises: a first NOT gate 14 and a second NOT gate 16, which respectively receive a first digital signal and a second digital signal from the input terminals thereof and reverse the logic states of the digital signals, wherein the digital signals may be identical or different in timing.

The output terminals of the first NOT gate 14 and the second NOT gate 16 are coupled to a CMOS (Complementary Metal Oxide Semiconductor) transistor 50. The CMOS transistor 50 receives the reversed first digital signal and the reversed second digital signal and drives a load 22. The CMOS transistor 50 includes: a PMOSFET 18 (P-channel Metal Oxide Semiconductor Field Effect Transistor) and an NMOSFET 20 (N-channel Metal Oxide Semiconductor Field Effect Transistor). The CMOS transistor 50 and the output terminals of the first NOT gate 14 and second NOT gate 16 are coupled to a comparing circuit 52. Two terminals of the comparing circuit 52 respectively receive the reversed first digital signal and the reversed second digital signal. The comparing circuit 52 detects the current of the load 22 and compares the detection result with the first digital signal and the second digital signal received from the two terminals and then selectively outputs a first electrical signal and a second electrical signal. The comparing circuit 52 includes: a first comparing circuit 522 and a second comparing circuit 524, which respectively generate the first electrical signal and the second electrical signal. The first comparing circuit 522 further comprises: a PMOSFET 24, a first resistor 26, a second resistor 28 and a comparator 36. The second comparing circuit 524 further comprises: an NMOSFET 34, a third resistor 30, a fourth resistor 32 and a second comparator 38. A first logic gate 54 is coupled the comparing circuit 52 to receive the first digital signal and the first electrical signal from the input terminal thereof and outputs a first signal from the output terminal thereof. A second logic gate 56 is coupled the comparing circuit 52 to receive the second digital signal and the second electrical signal from the input terminal thereof and outputs a second signal from the output terminal thereof. The first logic gate 54 may be a NOR gate 40, and the second logic gate 56 may be an AND gate 42. The negative input terminal of the first comparator 36 is coupled to the positive input terminal of the second comparator 38. The drain of the PMOSFET 18 is coupled to the drain of the NMOSFET 20. One side of the load 22 is coupled to the joint of the drain of the PMOSFET 18 and the drain of the NMOSFET 20, and the same side of the load 22 is also coupled to the joint of the negative input terminal of the first comparator 36 and the positive terminal input terminal of the second comparator 38. The other side of the load 22 is coupled to a reference voltage $V_{REF}$.

Below, the detail of the abovementioned circuit is described. The source of the PMOSFET 18 is coupled to a DC voltage $V_{DD}$, and the gate of the PMOSFET 18 is coupled to the output terminal of the first NOT gate 14. The gate of the PMOSFET 18 is also coupled to the gate of another PMOSFET 24. The source of the PMOSFET 24 is coupled to the DC voltage $V_{DD}$, and the drain of the PMOSFET 24 is coupled to one side of the first resistor 26. The other side of the first resistor 26 is coupled to the drain of the PMOSFET 18 via the second resistor 28. The positive input terminal and negative input terminal of the first comparator 36 are respectively coupled to two sides of the second resistor 28, and the positive input terminal of the first comparator 36 is coupled to a point between the first resistor 26 and the second resistor 28. The output terminal of the first comparator 36 is coupled to one input terminal of the NOR gate 40, and the input terminal of the NOR gate 40 also receives the first digital signal. The output terminal of the NOR gate 40 outputs the first signal. The source of the NMOSFET 20 is grounded, and the gate of the NMOSFET 20 is coupled to the output terminal of the second NOT gate 16. The input terminal of the second NOT gate 16 receives the second digital signal. The gate of the NMOSFET 20 is also coupled to the gate of another NMOSFET 34. The source of the NMOSFET 34 is grounded, and the drain of the NMOSFET 34 is coupled to one side of the fourth resistor 32. The other side of the fourth resistor 32 is coupled to the drain of the NMOSFET 20 via the third resistor 30. The positive input terminal and negative input terminal of the second comparator 38 are respectively coupled to two sides of the third resistor 30, and the negative input terminal of the second comparator 38 is coupled to between the third resistor 30 and the fourth resistor 32. The output terminal of the second comparator 38 is coupled to one input terminal of the AND gate 42, and the input terminal of the AND gate 42 also receives the second digital signal. The output terminal of the AND gate 42 outputs the second signal.

When the PMOSFET 18 is turned on and when the load 22 is too small or short-circuited to the ground, an overcurrent occurs. In such a case, overcurrent detection is undertaken by the upper part of the circuit of the present invention. When the NMOSFET 20 is turned on and when the load 22 is too small or short-circuited to the DC voltage $V_{DD}$, an overcurrent occurs. In such a case, overcurrent detection is undertaken by the lower part of the circuit of the present invention. As the digital signal can make only one MOSFET turned on, the present invention is suitable to be integrated with the circuit using CMOS transistors.

Figure 3A:
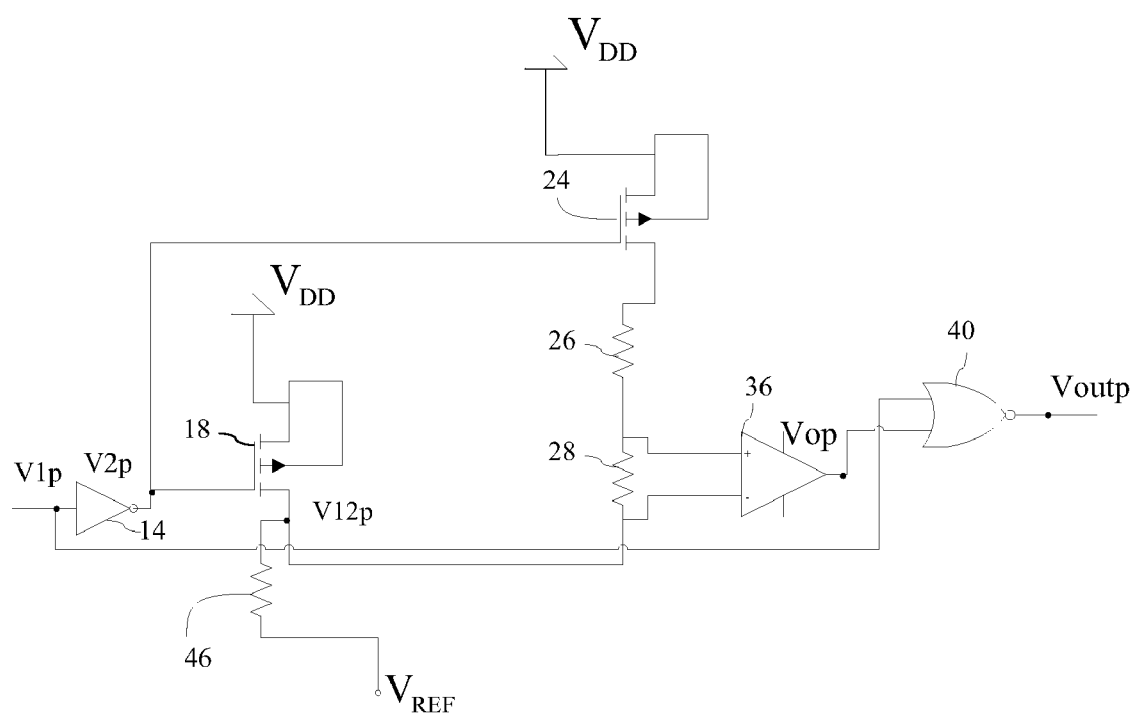
FIG. 3a is a diagram schematically showing a portion of the circuit of an overcurrent detection device according to the present invention.
Figure 3B:
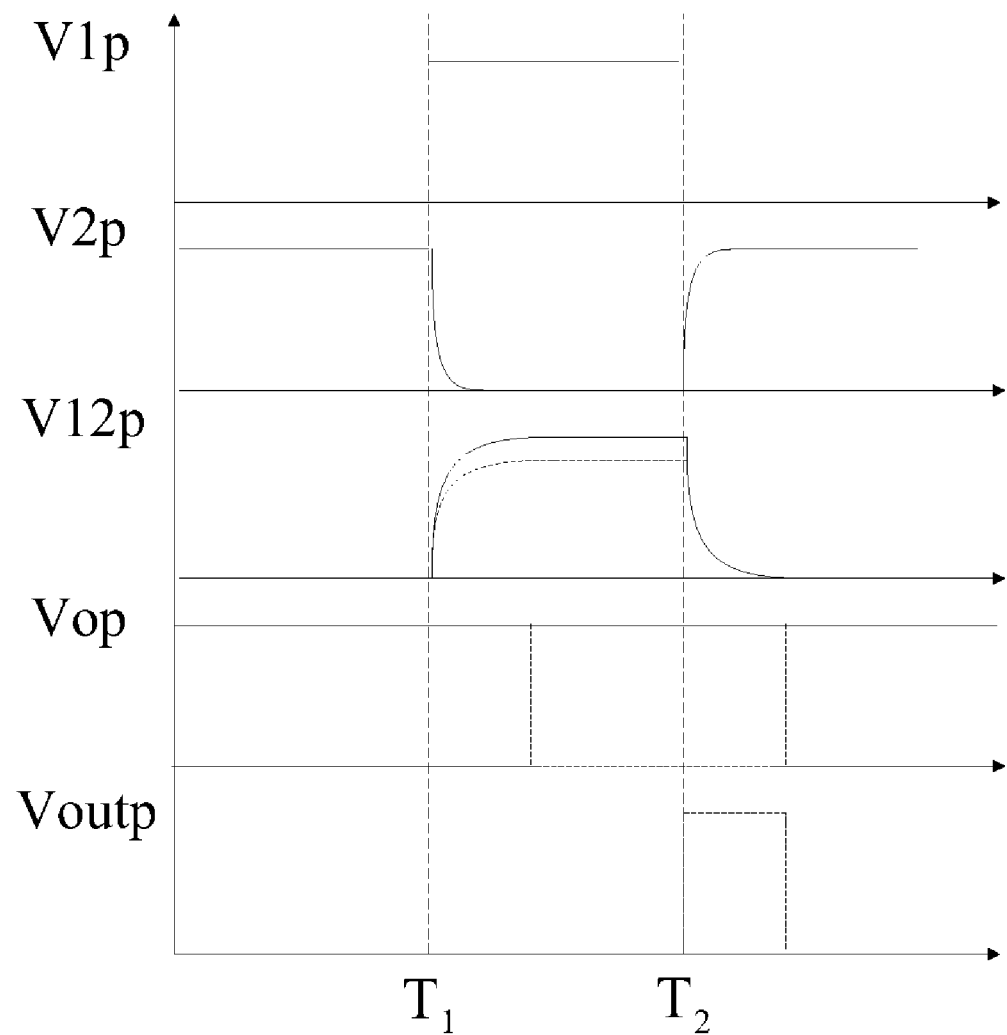
FIG. 3b is a diagram schematically showing the signal waveforms at some nodes of the circuit of an overcurrent detection device according to the present invention.

The operation of the upper part of the circuit of the present invention is to be independently described in detail below. Refer to FIG. 3a and FIG. 3b. In FIG. 3a, one side of a load 46 is coupled to only the drain of the PMOSFET 18, and the other side of the load 46 is coupled to a reference voltage $V_{REF}$ (as ground). FIG. 3b shows the waveforms of $V_{1p}$, $V_{2p}$, $V_{12p}$, $V_{op}$ and $V_{outp}$. Note the waveforms before the time $T_1$. When $V_{1p}$ is a low-level digital signal, $V_{2p}$ is a high-level digital signal. At this time, the PMOSFET 18 and the PMOSFET 24 are not turned on; therefore, $V_{12p}$ is at $V_{REF}$ voltage. At the same time, no voltage difference exists between two input terminals of the first comparator 36. In other words, the threshold voltage of the first comparator 36 is not exceeded. Therefore, $V_{op}$ is a high-level digital signal. $V_{1p}$ and $V_{op}$ are respectively input to the input terminals of the NOR gate 40, and the output $V_{outp}$ of the NOR gate 40 is thus a low-level digital signal. Refer to the waveforms between the time $T_1$ and the time $T_2$. When $V_{1p}$ is a high-level digital signal, $V_{2p}$ is a low-level digital signal. As the first NOT gate 14 delays outputting the signal slightly, the waveform slowly descends initially. At this time, the PMOSFET 18 and the PMOSFET 24 are both turned on, and the voltage $V_{12p}$ rises to a high level and maintains at the high level. For normal operation, the voltage difference between two input terminals of the first comparator 36 does not exceed the threshold voltage of the first comparator 36. Therefore, $V_{op}$ is also a high-level digital signal. Because of the input signals $V_{op}$ and $V_{1p}$, the NOR gate 40 outputs a low-level digital signal $V_{outp}$. However, when the current of the load 46 is too high or exceeds a critical value due to abnormal small value of load 46 or short circuit across load 46 or short circuit between $V_{12p}$ and any low voltage, the voltage $V_{12p}$ will decrease, as shown by the dotted line. At the same time, the voltage difference between two input terminals of the first comparator 36 exceeds the threshold voltage of the first comparator 36. Therefore, $V_{op}$ becomes a low-level digital signal. As the first comparator 36 also delays outputting the signal, the first comparator 36 takes a period of time to make $V_{op}$ become a low-level digital signal shown by the dotted line. Because of the input signals $V_{op}$ and $V_{1p}$, the output signal $V_{outp}$ is a low-level digital signal. Refer to the waveforms after the time $T_2$. When $V_{1p}$ descends to a low-level digital signal, $V_{2p}$ gradually rises to a high-level digital signal, and $V_{12p}$ is also gradually restored to a low-level digital signal. As the first comparator 36 delays outputting the signal, $V_{op}$ takes a period of time to rise to a high-level digital signal. Because of the input signals $V_{op}$ and $V_{1p}$, the NOR gate 40 outputs a positive pulse signal. The positive pulse signal is used to trigger a protection circuit to prevent the entire circuit from burnout. Thus the load current exceeds an overcurrent threshold, the positive pulse signal is sent out to trigger the protection circuit.

Figure 4A:
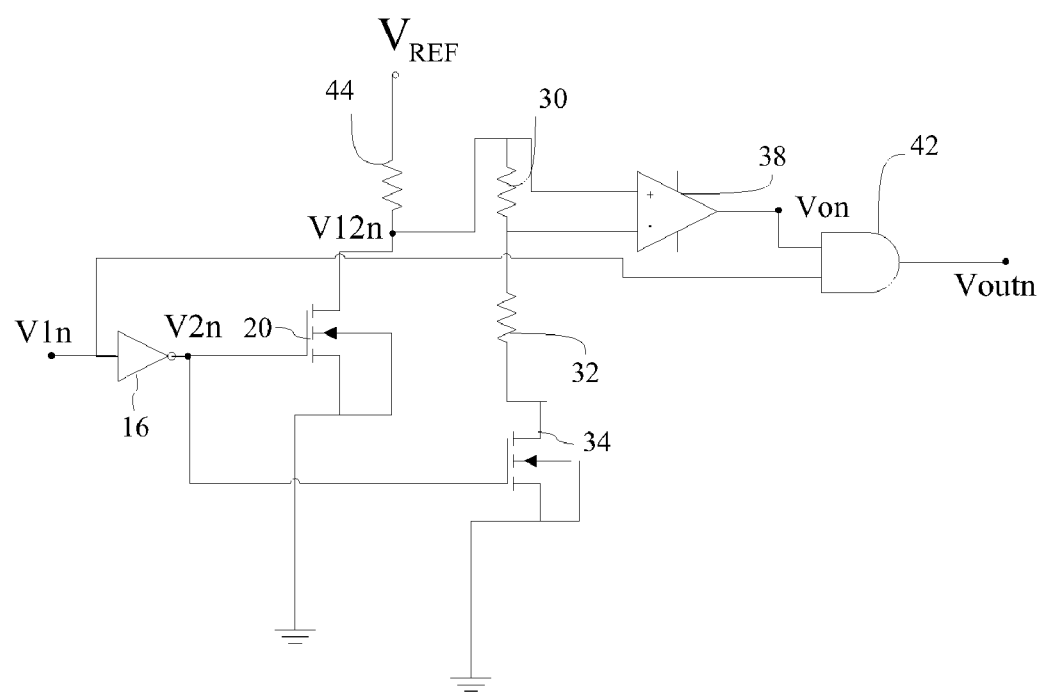
FIG. 4a is a diagram schematically showing another portion of the circuit of an overcurrent detection device according to the present invention.
Figure 4B:
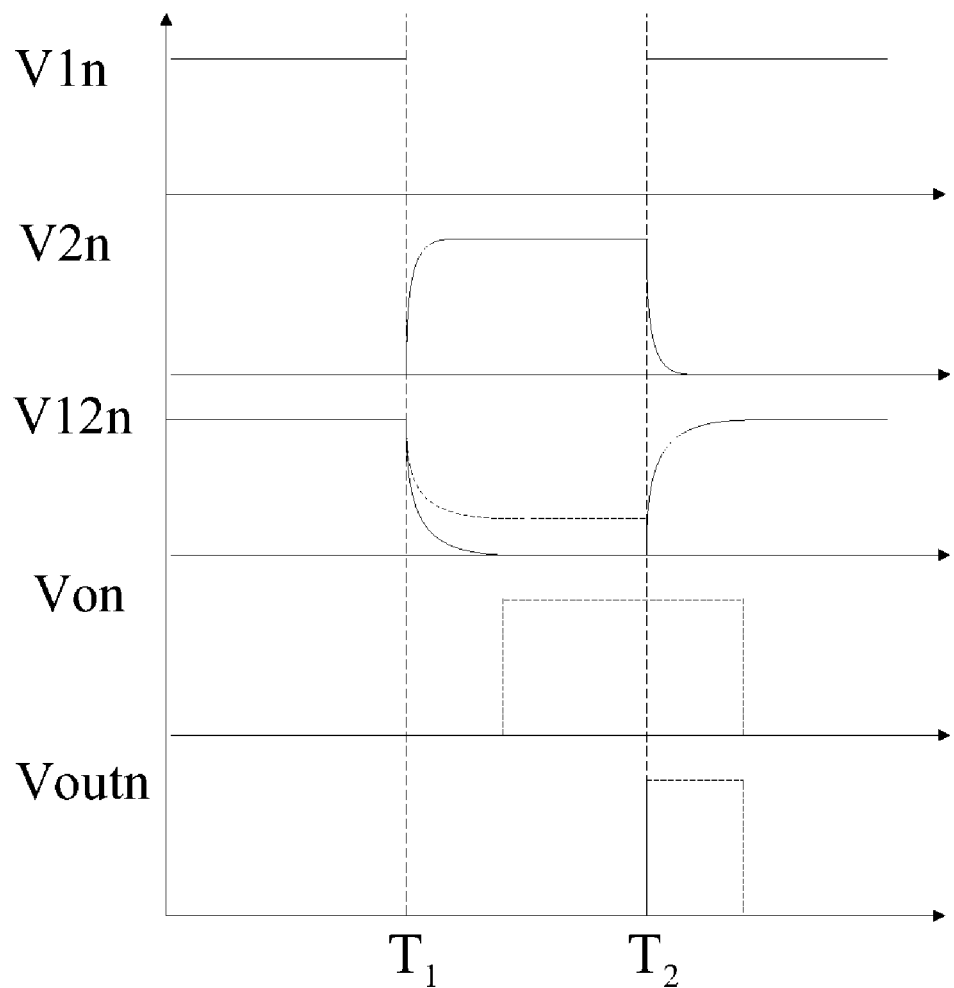
FIG. 4b is a diagram schematically showing the signal waveforms at some other nodes of the circuit of an overcurrent detection device according to the present invention.

The operation of the lower part of the circuit of the present invention is also to be independently described in detail below. Refer to FIG. 4a and FIG. 4b. In FIG. 4a, one side of a load 44 is coupled to only the drain of the NMOSFET 20, and the other side of the load 44 is coupled to a voltage $V_{REF}$ (as $V_{DD}$). FIG. 4b shows the waveforms of $V_{1n}$, $V_{2n}$, $V_{12n}$, $V_{on}$ and $V_{outn}$. Note the waveforms before the time $T_1$. When $V_{1n}$ is a high-level digital signal, $V_{2n}$ is a low-level digital signal. At this time, the NMOSFET 20 and the NMOSFET 34 are not turned on; therefore, $V_{12n}$ is at $V_{REF}$ voltage. At the same time, no voltage difference exists between two input terminals of the second comparator 38. In other words, the threshold voltage of the second comparator 38 is not exceeded. Therefore, $V_{on}$ is a low-level digital signal. $V_{1n}$ and $V_{on}$ are respectively input to the input terminals of the AND gate 42, and the output $V_{outn}$ of the AND gate 42 is thus a low-level digital signal. Refer to the waveforms between the time $T_1$ and the time $T_2$. When $V_{1n}$ is a low-level digital signal, $V_{2n}$ is a high-level digital signal. As the second NOT gate 16 delays outputting the signal slightly, the waveform slowly rises initially. At this time, the NMOSFET 20 and the NMOSFET 34 are both turned on, and the voltage $V_{12n}$ descends to a low level and maintains at the low level. At the same time, the voltage difference between two input terminals of the second comparator 38 does not exceed the threshold voltage of the second comparator 38. Therefore, $V_{on}$ is also a low-level digital signal. Because of the input signals $V_{on}$ and $V_{1n}$, the AND gate 42 outputs a low-level digital signal $V_{outn}$. However, when the current of the load 44 is too high or exceeds a critical value due to abnormal small value of load 44 or short circuit across load 44 or short circuit between $V_{12n}$ and any high voltage, the voltage $V_{12n}$ will rise, as shown by the dotted line. At the same time, the voltage difference between two input terminals of the second comparator 38 exceeds the threshold voltage of the second comparator 38. Therefore, $V_{on}$ becomes a high-level digital signal. As the second comparator 38 also delays outputting the signal, the second comparator 38 takes a period of time to make $V_{on}$ become a high-level digital signal shown by the dotted line. Because of the input signals $V_{on}$ and $V_{1n}$, the output signal $V_{outn}$ is a low-level digital signal. Refer to the waveforms after the time $T_2$. When $V_{1n}$ rises to a high-level digital signal, $V_{2n}$ gradually descends to a low-level digital signal, and $V_{12n}$ is also gradually restored to a high-level digital signal. As the second comparator 38 delays outputting the signal, $V_{on}$ takes a period of time to descend to a low-level digital signal. Because of the input signals $V_{on}$ and $V_{1n}$, the AND gate 42 outputs a positive pulse signal. The positive pulse signal is used to trigger a protection circuit to prevent the entire circuit from burnout. Thus the load current exceeds an overcurrent threshold, the positive pulse signal is sent out to trigger the protection circuit. Note that there is a difference between the second comparator 38 and the first comparator 36. When the voltage difference across the input terminals of the first comparator 36 exceeds the threshold of the first comparator 36, the first comparator 36 outputs a low-level digital signal. However, when the voltage difference across the input terminals of the second comparator 38 exceeds the threshold of the second comparator 38, the second comparator 38 outputs a high-level digital signal.

In conclusion, the present invention proposes an overcurrent detection device, which can accurately detect the overcurrent of the load in realtime via a digital circuit and digital signals, and which can integrate with CMOS to meet the trend of miniaturization and power efficiency.

The preferred embodiment described above is only to exemplify the present invention but not to limit the scope of the present invention. Therefore, any equivalent modification or variation according to the spirit or characteristics of the present invention is to be also included within the scope of the present invention.

What is claimed is:

1. An overcurrent detection device for a class D power amplifier that is coupled to a load, comprising:
   a first NOT gate receiving a first digital signal from an input terminal thereof and reversing a logic state of said first digital signal;
   a second NOT gate receiving a second digital signal from an input terminal thereof and reversing a logic state of said second digital signal;
   a CMOS (Complementary Metal Oxide Semiconductor) transistor with two terminals respectively coupled to an output terminal of said first NOT gate and an output terminal of said second NOT gate, receiving reversed said first digital signal and reversed said second digital signal, and driving said load;
   a comparing circuit with one terminal coupled to said CMOS transistor and another two terminals coupled to said output terminal of said first NOT gate and said output terminal of said second NOT gate, receiving reversed said first digital signal and reversed said second digital signal from said two terminals thereof, detecting current of said load, comparing a detection result with reversed said first digital signal and reversed said second digital signal received at said two terminals thereof, and selectively outputting a first electrical signal and a second electrical signal;
   a first logic gate coupled to said comparing circuit, receiving said first digital signal and said first electrical signal, and outputting a first signal from an output terminal thereof indicating an overcurrent condition of the class D power amplifier; and
   a second logic gate coupled to said comparing circuit, receiving said second digital signal and said second electrical signal, and outputting a second signal from an output terminal thereof indicating an overcurrent condition of the class D power amplifier.

2. The overcurrent detection device according to claim 1, wherein said CMOS transistor further comprises:
   a PMOSFET (P-channel Metal Oxide Semiconductor Field Effect Transistor) with a gate thereof coupled to said output terminal of said first NOT gate and a source thereof coupled to a DC (Direct Current) voltage; and
   an NMOSFET (P-channel Metal Oxide Semiconductor Field Effect Transistor) with a gate thereof coupled to said output terminal of said second NOT gate, a source thereof coupled to a ground voltage and a drain thereof coupled to a drain of said PMOSFET and said load.

3. The overcurrent detection device according to claim 1, wherein said comparing circuit further comprises: a first comparing circuit and a second comparing circuit, which respectively output said first electrical signal and said second electrical signal.

4. The overcurrent detection device according to claim 3, wherein said first comparing circuit includes:
   a PMOSFET with a gate thereof coupled to said output terminal of said first NOT gate and a source thereof coupled to a DC voltage;
   a first resistor with one side thereof coupled to said PMOSFET;
   a second resistor with one side thereof coupled to another side of said first resistor and another side thereof coupled to said second comparing circuit and said load; and
   a first comparator with a positive input terminal and a negative input terminal thereof respectively coupled to two sides of said second resistor, wherein said positive input terminal is coupled to between said first resistor and said second resistor, and outputting said first electrical signal.

5. The overcurrent detection device according to claim 3, wherein said second comparing circuit includes:
   a third resistor with one side thereof coupled to said first comparing circuit and said load;
   a fourth resistor with one side thereof coupled another side of said third resistor;
   an NMOSFET with a gate thereof coupled to said output terminal of said second NOT gate, a source thereof coupled to a ground voltage and a drain thereof coupled to another side of said fourth resistor;
   a second comparator with a positive input terminal and a negative input terminal thereof respectively coupled to two sides of said third resistor, wherein said negative input terminal of said second comparator is coupled to between said third resistor and said fourth resistor, and outputting said second electrical signal.

6. The overcurrent detection device according to claim 1, wherein said first logic gate is a NOR gate.

7. The overcurrent detection device according to claim 1, wherein said second logic gate is an AND gate.

8. The overcurrent detection device according to claim 5, wherein when said second digital signal is a low-level signal, and when current of said load exceeds a critical value, said second electrical signal is a high-level digital signal.

9. The overcurrent detection device according to claim 8, wherein when said second digital signal rises from a low level to a high level, said second signal is a positive pulse signal.

10. The overcurrent detection device according to claim 4, wherein when said first digital signal is a high-level signal, and when current of said load exceeds a critical value, said first electrical signal is a low-level digital signal.

11. The overcurrent detection device according to claim 10, wherein when said first digital signal descends from a high level to a low level, said first signal is a positive pulse signal.

12. The overcurrent detection device according to claim 1, wherein said first signal is a positive pulse signal or a low-level digital signal.

13. The overcurrent detection device according to claim 1, wherein said second signal is a positive pulse signal or a low-level digital signal.

14. The overcurrent detection device according to claim 1, wherein one side of said load is coupled to said CMOS transistor and said comparing circuit, and another side of said load is coupled to a reference voltage.

15. The overcurrent detection device according to claim 1, wherein said first digital signal and said second digital signal are an identical digital signal or different digital signals in timing.

* * * * *